Nov. 5, 1968 V. C. GARBARINI 3,409,523
ELECTROETCHING AN ALUMINUM PLATED SEMICONDUCTOR IN A TETRAALKYLAMMONIUM HYDROXIDE ELECTROLYTE
Filed March 10, 1966
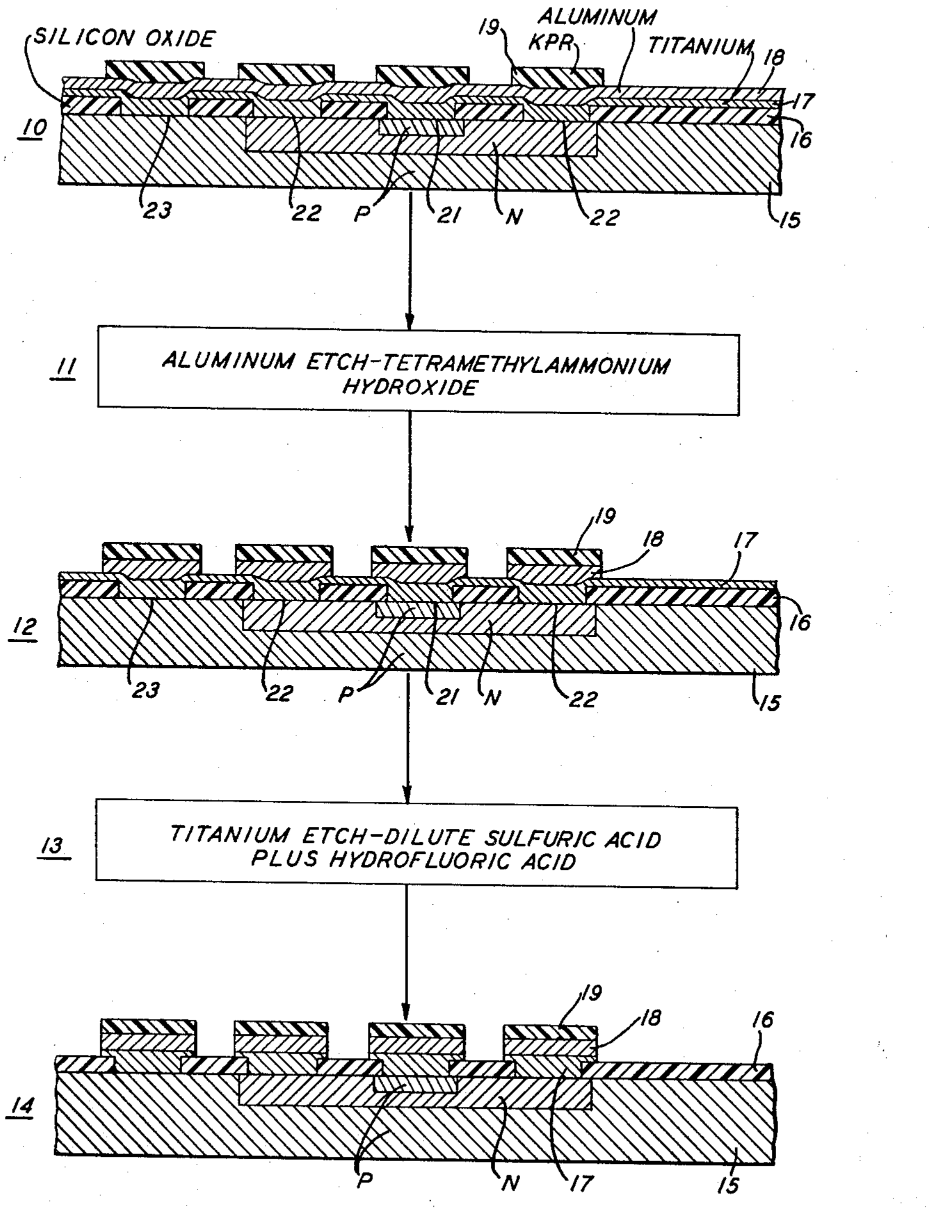
INVENTOR
V. C. GARBARINI
BY H. W. Lockhart
ATTORNEY United States Patent Office 3,409,523

Patented Nov. 5, 1968

3,409,523

ELECTROETCHING AN ALUMINUM PLATED SEMICONDUCTOR IN A TETRAALKYLAMMONIUM HYDROXIDE ELECTROLYTE

Victor C. Garbarini, Bethlehem, Pa., assignor to Bell Telephone Laboratories, Incorporated, New York, N.Y., a corporation of New York Filed Mar. 10, 1966, Ser. No. 533,288
9 Claims. (Cl. 204—143)

This invention relates to semiconductor device fabrication and more particularly to an electroetching technique for making metal contacts on planar semiconductor devices.

The structure and fabrication techniques relating to planar semiconductor devices using diffusion and oxide masking are well known. In the fabrication of such planar semiconductor devices it is a standard practice to deposit the metal films which will comprise the electrical contacts, initially over large areas of the semiconductor material, usually over an entire slice. Then by further masking and etching the metal films are reduced to the desired final configurations. During this processing it is important to avoid the use of reagents which contaminate the device or which leave harmful residues to degrade the electrical characteristics during the operation of the device. For example, it is now known that compounds containing sodium, such as sodium hydroxide, a common etchant, should be avoided inasmuch as the element sodium produces unwanted conducting channels on semiconductor surfaces, even beneath certain protective coatings.

Accordingly, an object of this invention is improved planar semiconductor devices.

A more particular object is an improved technique for fabricating planar semiconductor devices.

A specific object is an improved electroetching process for contacts on planar semiconductor devices.

In a specific embodiment in accordance with this invention, a body of silicon semiconductor material is processed to the point where it includes a plurality of diffused junctions with an oxide mask on the diffused surface thereof which defines the area of the metal-to-semiconductor-contacts. Upon this masked surface a thin layer of titanium first is deposited in accordance with the disclosure of Patent 3,106,489, granted Oct. 8, 1963, to M. P. Lepselter. Next, a thicker layer of aluminum is deposited over the titanium and on the aluminum surface a mask is formed to define the final configuration of the electrical contacts to the diffused zones. The mask is aligned with and conforms substantially to the underlying contact areas through the oxide mask.

The body of semiconductor material then is immersed in an electrolytic solution with the metal layers connected as the anode. It is important at this point to use an electrolyte which does not have deleterious effects on the semiconductor element, while at the same time producing efficient removal of the unmasked metal from the slice surface. In accordance with this invention an electrolyte comprising one from the class of tetraalkylammonium hydroxides provides an excellent rate of etching with sharply defined edges and with no apparent deleterious effects. In particular, these electrolytes leave no harmful residue which may ultimately degrade the characteristics of the device.

In this particular embodiment, using a layer of aluminum over a titanium layer the thick aluminum layer is removed by electroetching in a process which is self-limiting inasmuch as the electroetching does not substantially erode the underlying titanium. Accordingly, the titanium remains as an effective electrode until all the unmasked aluminum has been removed. The subsequent step of removing the underlying unmasked titanium is a simple and straightforward chemical etching operation.

A clearer understanding of the invention and its other objects and features may be had from the following more detailed description taken in conjunction with the drawing which shows the successive steps in the fabrication of planar semiconductor contacts in accordance with this invention.

Referring to the drawing, a silicon transistor element 10 of the PNP configuration is shown in sectional view. It will be understood that the fabrication steps to be described generally are accomplished on an entire slice of silicon semiconductor material containing as many as several hundred of such transistor elements. However, for ease of explanation only a single element, as it would appear after separation from the slice, is shown. The element 10 is shown at that stage of fabrication at which the oxide mask 16 defining the contact areas is in place and successive layers of metal have been deposited thereover. In particular, contacts are applied through the oxide layer 16 to the P-type diffused emitter zone in the area 21, and likewise to the N-type diffused base zone in the area 22, which in this instance, is ring-shaped. Contact also is made to the collector zone on the top surface of the element in the area 23. The initial layer 17 comprises a film of titanium having a thickness of about 200 Angstroms. Over this layer 17 a second layer 18 of aluminum having a thickness of from 20,000 to 40,000 Angstroms is deposited.

Next, a photoresist mask 19 is formed in substantial alignment with the contact areas to the several zones of the element. The techniques for producing such masks using Kodak photoresist materials are well known in the art, as exemplified by Patent 3,122,817 to J. Andrus.

In the next step, as indicated by the box 11, the slice is immersed in the electroetching solution comprising, in one specific form, a two percent aqueous solution of tetramethylammonium hydroxide at 25 degrees centigrade. Typically, the slice may be suspended in the solution using metal tweezers which comprise one electrode connection. A suitable cathode for the electrolytic process is a small rod of molybdenum, positioned about one inch away from the aluminum surface of the slice. After passing current through the solution for several minutes visual observation indicates completion of removal of the aluminum layer which is not covered by the photoresist mask. A typical etching rate at a current of 200 milliamperes is about 10,000 Angstroms per minute. Thus, for a power transistor having an aluminum layer about 40,000 Angstroms thick, an etching period of four to five minutes is effective.

In particular, this electroetching procedure provides relatively sharply defined edges with substantially no under-cutting of the photoresist mask. Such under-cutting is undesirable for obvious reasons and in particular because of the desirability of having the metal contact electrodes overlap the projections of the PN junction boundaries in accordance with the teachings of M. P. Lepselter in his patent application, Ser. No. 331,168, now U.S. Patent 3,287,612, assigned to the same assignee as this application. The process is useful for all practical thicknesses of aluminum, in particular, from 2000 to about 40,000 Angstroms. It is most advantageous in the 20 to 40 thousand Angstrom range. Moreover, as indicated above, the electrolyte disclosed herein is free of harmful sodium, although of equal effectiveness to sodium hydroxide previously used for such processing. This electrolytic process appears advantageous also in comparison with the acid etches which generally require somewhat longer periods of time during which the KPR mask tends to deteriorate.

The semiconductor element 12 is shown upon the completion of the electroetching step with the aluminum layer confined to the portions masked by the photoresist layer 19. The next step, as indicated by box 13 is a chemical etching step wherein the slice is immersed in a solution of dilute sulphuric acid and hydrofluoric acid. This treatment effectively removes the unmasked underlying thin titanium layer, leaving the sharply defined contacts as depicted by the semiconductor element 14. Subsequent fabrication of the device includes removal of the photoresist mask, division of the slice into individual elements, suitable mounting, application of external leads and encapsulation of the individual transistor elements.

Accordingly, there has been disclosed an advantageous electrolytic etching process for the convenient fabrication of aluminum contacts on silicon semiconductor devices. Although the invention has been disclosed in terms of a specific embodiment, it will be understood that alternative arrangements may be devised by those skilled in the art which likewise will be within the spirit and scope of the invention.

More particularly, although tetramethylammonium hydroxide is a preferred embodiment, the invention may be practiced with any one of the class of tetraalkyl hydroxides denoted by the generic expression $R_4N^+(OH)^-$, where R is any of the series including ethyl, methyl, propyl, butyl and combinations thereof. The hydroxide solution should have the characteristics of a strong base to avoid precipitation of dissolved aluminum, good electrical conductivity, and leave no harmful residues.

What is claimed is:

1. The method of etching aluminum plated on semiconductor material comprising immersing the aluminum plated material in an aqueous solution of tetraalkylammonium hydroxide denoted by the generic expression $R_4N^+(OH)^-$, where R is selected from the series consisting of ethyl, methyl, propyl and butyl with a metal cathode member and biasing said cathode negatively with respect to the aluminum plating.

2. The method in accordance with claim 1 in which said semiconductor material is silicon.

3. The method in accordance with claim 2 in which said solution comprises tetraethylammonium hydroxide.

4. The method in accordance with claim 2 in which said solution comprises tetramethylammonium hydroxide.

5. The method in accordance with claim 2 in which said solution comprises tetrapropylammonium hydroxide.

6. The method in accordance with claim 2 in which said solution comprises tetrabutylammonium hydroxide.

7. The method of forming contact electrodes on diffused junction planar silicon transistors comprising defining contact areas on silicon surfaces, depositing successive layers of titanium and aluminum over said surfaces and within said defined contact areas, masking said metal layers, and immersing said material in an aqueous solution of tetramethylammonium hydroxide with a metal cathode member and biasing said cathode negatively with respect to the aluminum layer for a period of time sufficient to remove the unmasked aluminum layer.

8. The method in accordance with claim 3 in which said titanium layer has a thickness of 200 Angstroms and said aluminum layer has a thickness of about 2000 to 40,000 Angstroms.

9. A method in accordance with claim 3 in which said aluminum layer has a thickness of about 20,000 to 40,000 Angstroms and said bias is effective to produce a current of about 200 milliamperes for a period of from three to five minutes.

References Cited

UNITED STATES PATENTS

| | | | |
|---|---|---|---|
| 2,849,349 | 8/1958 | Ziegler et al. | 204—14 |
| 3,160,539 | 12/1964 | Hall et al. | 148—1.5 |

ROBERT K. MIHALEK, *Primary Examiner.*